United States Patent
Ikeda et al.

(10) Patent No.: US 9,097,747 B2
(45) Date of Patent: Aug. 4, 2015

(54) ELECTRONIC DEVICE, AND CAPACITOR CAPACITANCE DETECTION METHOD APPLIED TO THE SAME

(75) Inventors: Erika Ikeda, Yokohama (JP); Hiroki Matsushita, Kawasaki (JP); Takehiko Katou, Kawasaki (JP); Osamu Kawashima, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 809 days.

(21) Appl. No.: 13/305,432

(22) Filed: Nov. 28, 2011

(65) Prior Publication Data

US 2012/0161792 A1    Jun. 28, 2012

(30) Foreign Application Priority Data

Dec. 24, 2010 (JP) ................................. 2010-288832

(51) Int. Cl.
*G01R 27/26* (2006.01)
*G01D 5/24* (2006.01)
*G06K 9/00* (2006.01)

(52) U.S. Cl.
CPC .............. *G01R 27/2605* (2013.01); *G01D 5/24* (2013.01); *G06K 9/0002* (2013.01); *G01R 27/26* (2013.01)

(58) Field of Classification Search
CPC ...... G01R 27/2605; G01R 27/26; G01D 5/24; G06K 9/0002
USPC .................. 324/658, 649, 600, 678, 548, 519
See application file for complete search history.

(56) References Cited

U.S. PATENT DOCUMENTS

| | | | |
|---|---|---|---|
| 5,497,095 A | | 3/1996 | Ueyama et al. |
| 5,811,978 A | * | 9/1998 | Tsubone ....................... 324/678 |
| 6,501,236 B1 | * | 12/2002 | Smith ........................... 315/311 |
| 7,380,891 B2 | * | 6/2008 | Ohashi et al. ................. 303/199 |
| 8,638,634 B2 | * | 1/2014 | Hauck .......................... 365/229 |
| 2007/0297812 A1 | * | 12/2007 | Takeuchi et al. .............. 398/202 |

FOREIGN PATENT DOCUMENTS

| | | |
|---|---|---|
| JP | 05-172877 A | 7/1993 |
| JP | 08-094684 | 4/1996 |
| JP | 2001-351695 A | 12/2001 |
| JP | 2003-127822 A | 5/2003 |
| JP | 2005-106616 | 4/2005 |
| JP | 2009-204558 A | 9/2009 |

(Continued)

OTHER PUBLICATIONS

First Office Action mailed by Japan Patent Office on Apr. 9, 2013 in the corresponding to Japanese patent application No. 2010-288832 in 7 pages.

*Primary Examiner* — Hoai-An D Nguyen
(74) *Attorney, Agent, or Firm* — Knobbe Martens Olson & Bear LLP

(57) ABSTRACT

According to one embodiment, an electronic device includes a capacitor, a power supply device, a discharger and a capacitance detector. The capacitor is used as a backup power supply. The power supply device charges the capacitor. The discharger discharges the capacitor. The capacitance detector maintains a terminal voltage of the capacitor at a given level for a predetermined time, by controlling an operating time of the power supply device. The capacitance detector allows the discharger to start the discharge the predetermined time later. The capacitance detector detects a capacitance of the capacitor based on a transient response characteristic of the discharge.

20 Claims, 6 Drawing Sheets

(56) References Cited

FOREIGN PATENT DOCUMENTS

| | | |
|---|---|---|
| JP | 2009-236962 | 10/2009 |
| JP | 2010-086448 | 4/2010 |
| JP | 2010-108385 | 5/2010 |
| JP | 2010-122857 | 6/2010 |

* cited by examiner

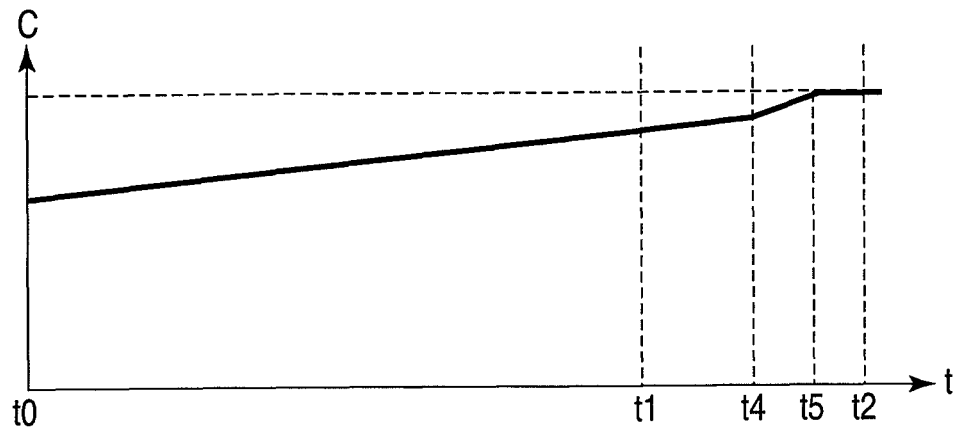
F I G. 4
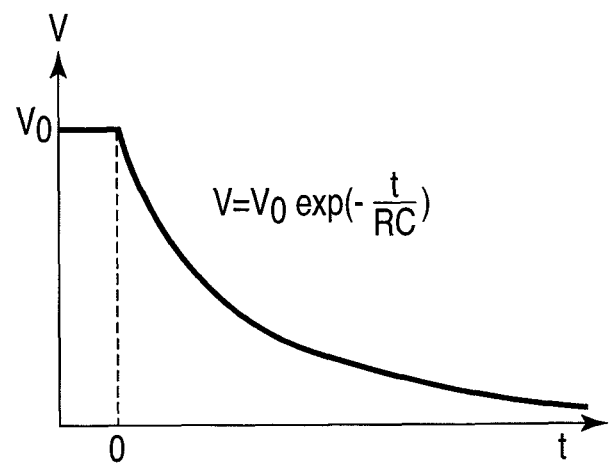
F I G. 5

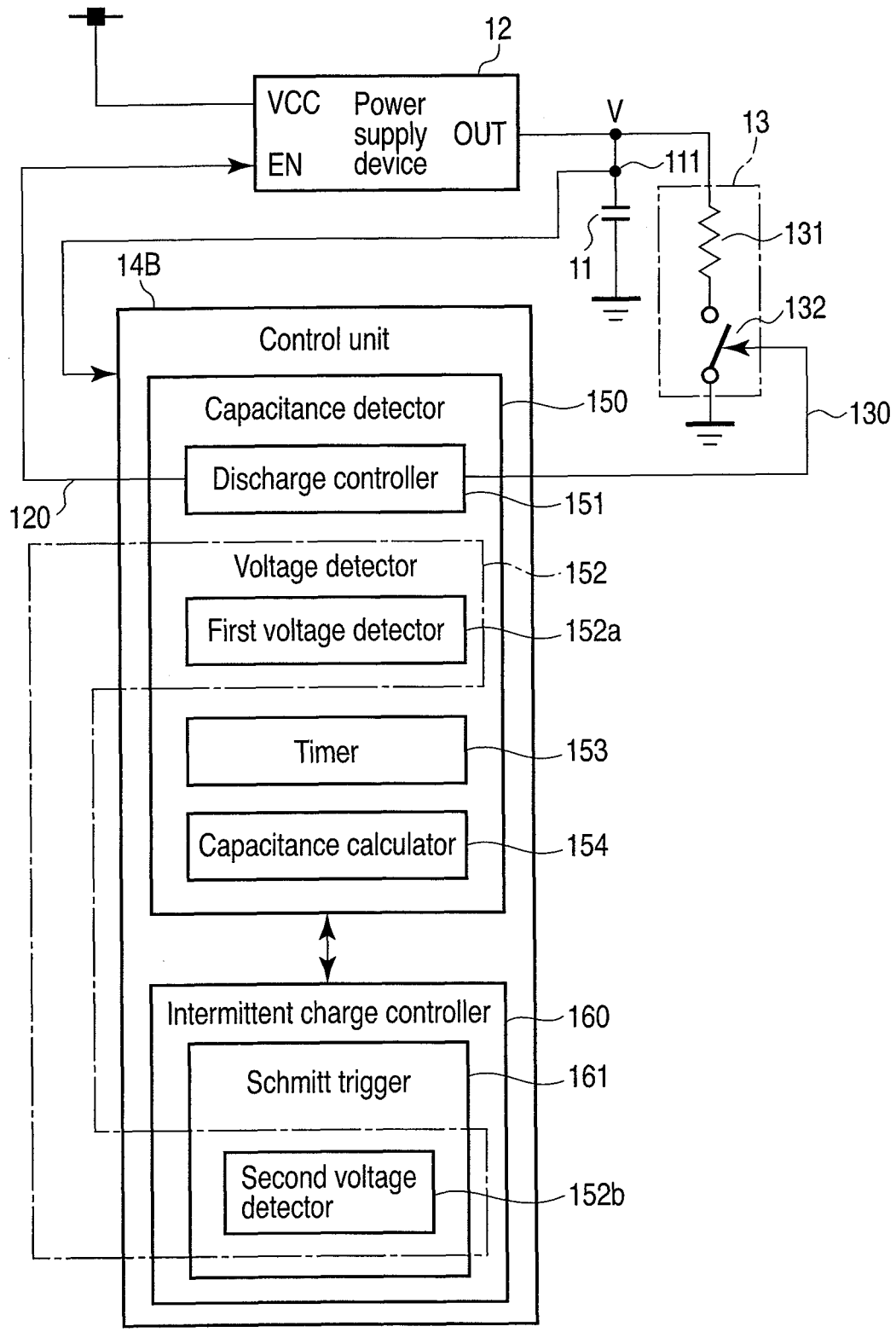
F I G. 8

ELECTRONIC DEVICE, AND CAPACITOR CAPACITANCE DETECTION METHOD APPLIED TO THE SAME

CROSS-REFERENCE TO RELATED APPLICATIONS

This application is based upon and claims the benefit of priority from prior Japanese Patent Application No. 2010-288832, filed Dec. 24, 2010, the entire contents of which are incorporated herein by reference.

FIELD

Embodiments described herein relate generally to an electronic device having a capacitor, and a capacitor capacitance detection method applied to the electronic device.

BACKGROUND

Recently emerging types of electronic devices such as solid-state drives (SSDs) comprise a backup power supply. A capacitor of an electric double layer type is commonly used as such a backup power supply.

Degradation of a capacitor appears as a change in the capacitance of the capacitor. Thus, it is known that the capacitance of the capacitor is detected in order to predict possible rapid degradation of the capacitor. It is also known that the capacitance of the capacitor is detected (or measured) by utilizing transient response characteristics observed when the charge stored in the capacitor is discharged.

The recent electronic devices having a capacitor as a backup power supply provide an intermittent charging control function to intermittently charge the capacitor in order to prevent possible overcharging that may cause the capacitor to be degraded. Immediately after charging or with the capacitor intermittently charged, a voltage applied to the capacitor (that is, the terminal voltage of the capacitor) is not constant. In such a state, the capacitance of the capacitor is not saturated. Thus, accurately detecting the capacitance utilizing the transient response characteristics is difficult.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 4 is a diagram illustrating an exemplary state in which the capacitance of the capacitor stabilizes as time elapses if the charge current and the terminal voltage vary as shown in FIG. 3;

FIG. 5 is a waveform diagram illustrating an exemplary relationship between time and the terminal voltage of the capacitor obtained during transient response of the capacitor;

FIG. 8 is a block diagram showing an exemplary configuration of an electronic device according to a third embodiment.

DETAILED DESCRIPTION

Various embodiments will be described hereinafter with reference to the accompanying drawings.

In general, according to one embodiment, an electronic device comprises a capacitor, a power supply device, a discharger and a capacitance detector. The capacitor is configured to be used as a backup power supply. The power supply device is configured to charge the capacitor. The discharger is configured to discharge the capacitor. The capacitance detector is configured to maintain a terminal voltage of the capacitor at a given level for a predetermined time, by controlling an operating time of the power supply device. The capacitance detector is configured to allow the discharger to start the discharge the predetermined time later. The capacitance detector is configured to detect a capacitance of the capacitor based on a transient response characteristic of the discharge.

[First Embodiment]

Figure 1:
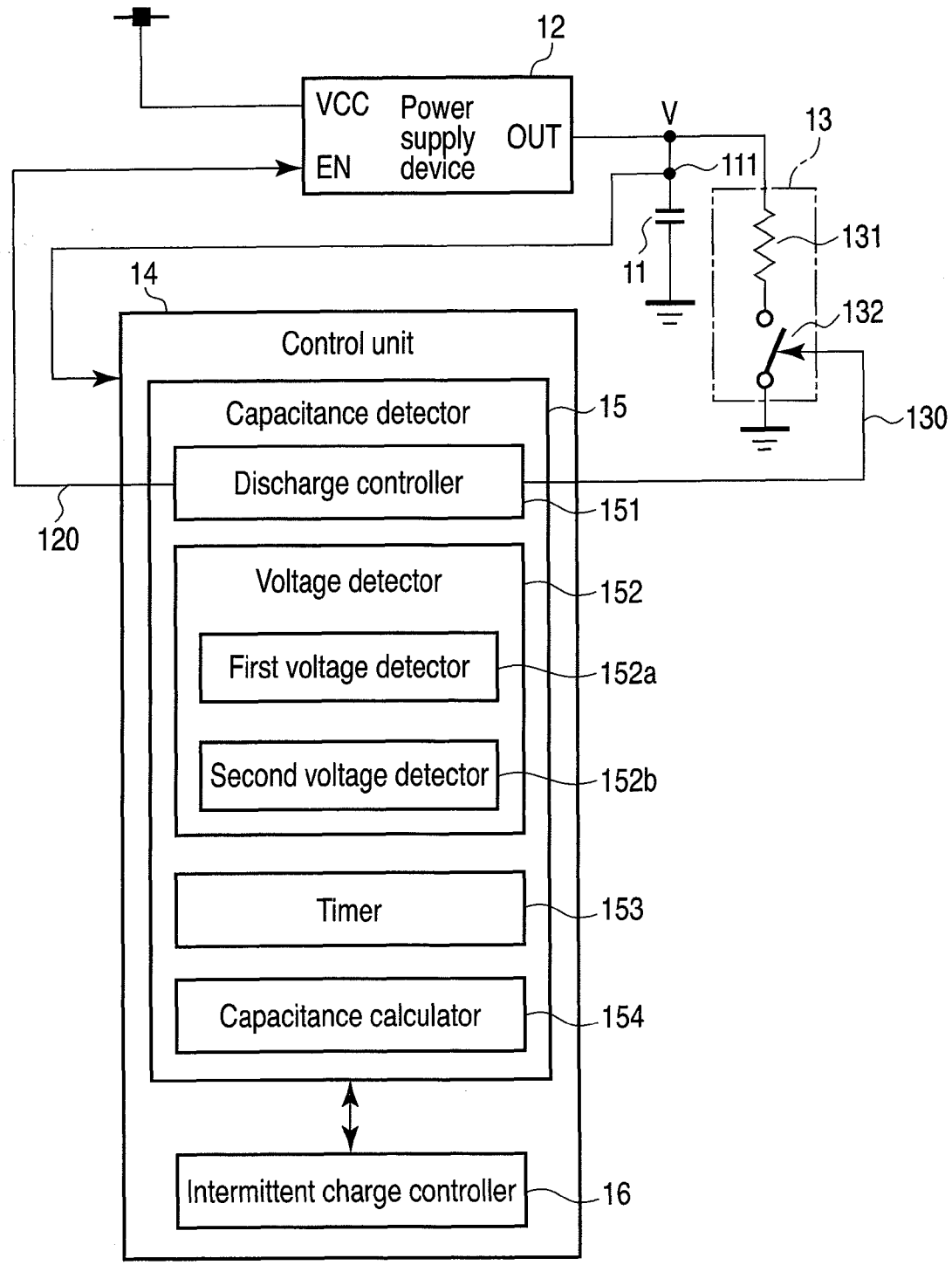
FIG. 1 is a block diagram showing an exemplary configuration of an electronic device according to a first embodiment.

FIG. 1 is a block diagram showing an exemplary configuration of an electronic device according to a first embodiment. In the first embodiment, the electronic device illustrated in FIG. 1 is assumed to be a solid-state drive (SSD). However, the electronic device illustrated in FIG. 1 may be a hard disk drive (HDD). Alternatively, the electronic device illustrated in FIG. 1 may be an electronic device different from the electronic device such as an SSD or HDD.

The electronic device illustrated in FIG. 1 comprises a capacitor 11, a power supply device 12, a discharger 13, and a control unit 14. The capacitor 11 is used as a backup power supply for the electronic device illustrated in FIG. 1. The capacitor 11 is of, for example, an electric double layer type. However, capacitor 11 need not be of the electric double layer type.

While enabled, the power supply device 12 charges the capacitor 11. The power supply device 12 comprises an enable terminal EN to which an enable signal 120 from the control unit 14 is input. The power supply device 12 is set enabled while the enable signal 120 is asserted. The power supply device 12 is of, for example, a constant-voltage constant-current (CVCC) type. In an initial stage of charging, the power supply device 12 performs constant-current control to supply a constant current Ic to the capacitor 11. When the capacitor 11 is sufficiently charged for at least a predetermined time, the terminal voltage V of the capacitor 11 reaches a constant voltage VH. In this state, the power supply device 12 shifts to constant-voltage control. The constant voltage VH is also referred to as the first voltage VH or simply voltage VH.

The discharger 13 is used to detect the capacitance of the capacitor 11. The discharger 13 discharges the capacitor 11. That is, the discharger 13 emits charge accumulated in the capacitor 11. The discharger 13 comprises a resistor 131 and a switch 132. The resistor 131 and the switch 132 are connected in series with one end 111 of the capacitor 11. The resistor 131 has a given resistance R. The switch 132 is turned on and off in accordance with a control signal 130 from a discharge controller 151 in the control unit 14 which will be described below. The switch 132 is of, for example, a field-effect transistor (FET) type. However, the switch 132 need not be of the FET type.

The control unit 14 controls each section in the electronic device. The control unit 14 comprises a capacitance detector 15 and an intermittent charge controller 16. The capacitance detector 15 detects the capacitance C of the capacitor 11. The capacitance detector 15 comprises a discharge controller 151, a voltage detector 152, a timer 153, and a capacitance calculator 154.

When the capacitance of the capacitor 11 is detected, the discharge controller 151 sets the discharger 13 (more specifically, the switch 132 in the discharger 13) to an on state to allow the discharger 13 to start discharging the capacitor 11. The discharger 13 (more specifically, the switch 132 in the discharger 13) is set in the on state while the discharge controller 151 is asserting the control signal 130. The discharge controller 151 asserts the control signal 130 if a predetermined period Thold elapses from the time when the terminal voltage V of the capacitor 11 reaches a voltage VLH (second voltage) or higher. VLH is lower than voltage VH (first voltage) and higher than a voltage VL (third voltage) described below. That is, VL<VLH<VH. More specifically, in the present embodiment, detection of VLH is carried out to pre-detect that the terminal voltage V has reached VH and is then to be kept at VH. Thus, VLH is set smaller than VH by a predetermined amount ΔV and higher than VL. That is, VL<VLH (=VH−ΔV)<VH.

The discharge controller 151 also negates the control signal 130 if the terminal voltage V reaches VL or lower while the control signal 130 is being asserted. In the first embodiment, the discharge controller 151 is assumed to be, for example, a functional module (that is, a software module) implemented when a microprocessor reads and executes a control program (hereinafter referred to as firmware) stored in a program memory. However, the discharge controller 151 may comprise a hardware module.

The voltage detector 152 comprises a first voltage detector 152a and a second voltage detector 152b. The first voltage detector 152a detects that the terminal voltage V of the capacitor 11 has reached VLH or higher. In the first embodiment, the first voltage detector 152a is a hardware module and is, for example, a comparator configured to compare the terminal voltage V with VLH, which serves as a reference voltage. The second voltage detector 152b detects that the terminal voltage V of the capacitor 11 has reached VL or lower. In the first embodiment, the second voltage detector 152b is a hardware module and is, for example, a comparator configured to compare the terminal voltage V with VL, which serves as a reference voltage. However, the first voltage detector 152a and the second voltage detector 152b may comprise software modules.

The timer 153 measures the predetermined period Thold from the time when the detector detects that the terminal voltage V of the capacitor 11 has reached VLH or higher. The timer 153 also measures a period Tc for which the control signal 130 has been asserted. That is, the timer 153 also measures period Tc from the completion of measurement of period Thold until the detector detects that the terminal voltage V of the capacitor 11 has reached VL or lower. In the first embodiment, the timer 153 is a hardware timer. However, the timer 153 may a software timer. The capacitance calculator 154 calculates (detects) the capacitance of the capacitor 11 based on the measured period Tc. In the first embodiment, the capacitance calculator 154 is a software module. However, the capacitance calculator 154 may be a hardware module.

The intermittent charge controller 16 has a well-known intermittent charge control function to intermittently charge the capacitor 11. The intermittent charge controller 16 is enabled when set to an intermittent charge mode. The intermittent charge controller 16 performs intermittent charge control to prevent possible overcharging that may cause the capacitor 11 to be degraded. This enables the life of the capacitor 11 to be prolonged. In the first embodiment, the intermittent charge controller 16 is a hardware module comprising a well-known Schmitt trigger. However, the intermittent charge controller 16 may be a software module.

Figure 2:
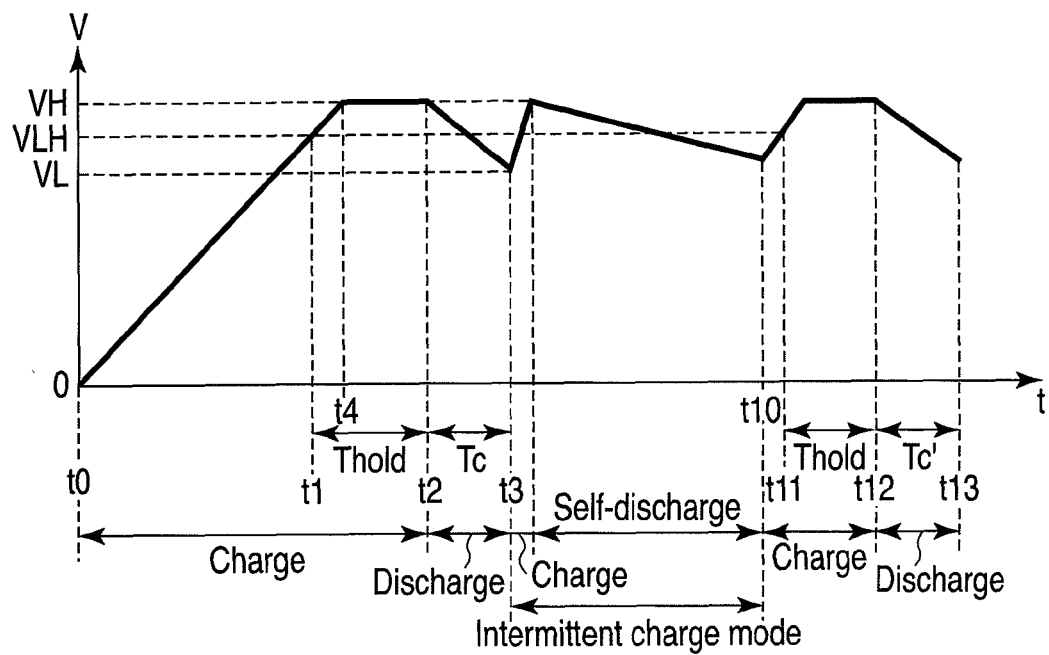
FIG. 2 is a voltage waveform diagram illustrating an exemplary relationship between the terminal voltage of the capacitor and time, wherein the terminal voltage is measured at the time of detection of the capacitance of the capacitor and before and after the detection.

Now, the operation of the first embodiment will be described with reference to FIG. 2 taking as an example a case where the capacitance C of the capacitor 11 is detected. FIG. 2 is a voltage waveform diagram illustrating the relationship between the terminal voltage V of the capacitor 11 and time; the terminal voltage is measured at the time of detection of the capacitance C of the capacitor 11 and before and after the detection.

First, it is assumed that at time $t_0$, the discharge controller 151 of the capacitance detector 15 asserts the enable signal 120, negates the control signal 130, and sets the intermittent charge mode to an off state. The power supply device 12 is set enabled (on state) when the enable signal 120 is asserted. Thus, the power supply device 12 operates based on a power supply voltage VCC applied by a main power supply (not shown in the drawings) for the electronic device. More specifically, the power supply device 12 operates as a constant-voltage constant-current power supply for charging the capacitor 11 within the preset ranges of the voltage and the current, depending on the state of the capacitor 11 (that is, a load state). During an initial period of charging, the power supply device 12 supplies the capacitor 11 with the constant current Ic. Thus, the terminal voltage V of the capacitor 11 rises as shown in FIG. 2.

It is assumed that the terminal voltage V subsequently reaches voltage VLH at time t1. Then, the first voltage detector 152a detects that the terminal voltage V has reached VLH or higher. The timer 153 measures period Thold elapsing from time t1 when the detector detects that terminal voltage V has reached VLH or higher. Even during period Thold, the terminal voltage V is raised based on the constant current control performed by the power supply device 12. At this time, the intermittent charge controller 16 is not set to the intermittent charge mode. Thus, the intermittent charge control is disabled (or stopped). That is, the intermittent charge control intended for the capacitor 11 is inhibited. Hence, upon reaching voltage VH at time t4, the terminal voltage V of the capacitor 11 is maintained at VH based on the constant voltage control performed by the power supply device 12.

Period Thold is set to be sufficient to maintain the terminal voltage V at VH. During the initial part of period Thold, the terminal voltage rises from VLH to VH. However, during the remaining part of period Thold, the terminal voltage V is maintained at VH. That is, the terminal voltage V is ensured to be maintained at VH during period Thold. Thus, the state of the terminal voltage V during period Thold is expressed as the state in which the terminal voltage V is maintained at a given level. Furthermore, an operation of charging the capacitor 11 during period Thold is hereinafter referred to as precharging (more specifically, precharging for detecting the capacitance C of the capacitor 11).

Figure 3:
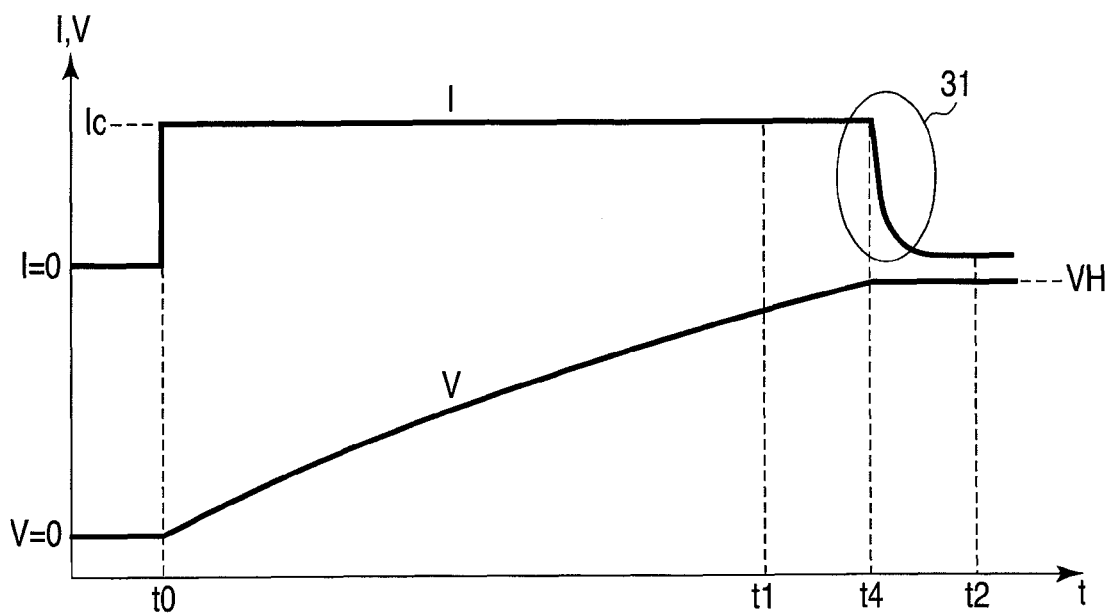
FIG. 3 is a waveform diagram illustrating an exemplary relationship between time and a charge current used to charge the capacitor and an exemplary relationship between the terminal voltage of the capacitor and time.

FIG. 3 is a waveform diagram illustrating the relationship between time t and a charge current I used to charge the capacitor 11 and the relationship between the terminal voltage V of the capacitor 11 and time t. As is apparent from FIG. 3, during the initial period of charging (the period from $t_0$ to t₄), when the terminal voltage V rises, the constant current control is performed by the function of the power supply device 12 serving as a constant-voltage constant-current power supply. Thus, the charge current I is constant and equal to the constant current Ic. When the terminal voltage V reaches VH, the predetermined constant voltage, at time t₄, the power supply device 12 shifts to the constant voltage control.

However, immediately after time t4, when the power supply device 12 shifts to the constant voltage control, the charge current I decreases slowly as shown within an elliptical outline 31 in FIG. 3. This is because as a result of the function of the power supply device 12 serving as a constant-voltage constant-current power supply, the terminal voltage V is constant (VH), whereas the capacitance C of the capacitor 11 rises slowly. After the power supply device 12 shifts to the constant voltage control, the relationship between the capacitance C and the current I follows the case where dV/dt corresponding to V of Equation 10 is 0, as described below. After the power supply device 12 shifts to the constant voltage control, the capacitance C slowly settles down to a constant value as time t elapses. FIG. 4 illustrates how the capacitance C stabilizes as time t elapses if the charge current I and the terminal voltage V vary as shown in FIG. 3.

As described above, a slight amount of time is required to stabilize the capacitance C of the capacitor 11. If the capacitor 11 is discharged and the capacitance C is detected utilizing transient response characteristics before the capacitance C is stabilized, accurately detecting the capacitance C is difficult as described below. Thus, the discharge controller 151 sufficiently carries out precharging so as to stabilize the capacitance of the capacitor 11 (so as to stabilize the terminal voltage V of the capacitor 11 at the predetermined voltage (VH)) before the capacitor 11 is discharged. In the example illustrated in FIG. 2 and FIG. 3, the terminal voltage V at time t₀ is zero. However, the terminal voltage V at time t₀ is not necessarily zero.

It is assumed that the timer 153 finishes measuring period Thold at time t₂ (t₂>t₄) shown in FIG. 2. At time t₂, the discharge controller 151 negates the enable signal 120 and asserts the control signal 130. Thus, the switch 132 of the discharger 13 is turned on. Then, the charge accumulated in the capacitor 11 is emitted via the resistor 131 of the discharger 13. That is, the current I flows from the capacitor 11 to the resistor 131. The timer 153 starts measuring the time again at time t₂.

When the capacitor 11 is discharged, the terminal voltage V of the capacitor 11 decreases as shown in FIG. 2. It is assumed that the terminal voltage V subsequently reaches voltage VL at time t3. Then, the second voltage detector 152b detects that the terminal voltage V has reached VL or lower. The timer 153 measures period Tc from time t₂ to time t₃. At time t₃, the detector detects that the terminal voltage V has reached VL or lower.

The capacitance calculator 154 calculates the capacitance C of the capacitor 11 based on the measured period Tc. The calculation of the capacitance C carried out by the capacitance calculator 154 will be described below in detail. First, it is assumed that the terminal voltage V of the capacitor 11 is V₀ when the capacitor 11 is sufficiently charged. In this state, when the capacitor 11 is discharged via the discharger 13, the terminal voltage V of the capacitor 11 falls in accordance with Equation 1 expressing a transient response.

$$V = V_0 \exp(-t/RC) \quad (1)$$

In Equation 1, V₀ denotes the terminal voltage V of the capacitor 11 obtained when discharge is started, that is, the initial value of V in the transient response. R denotes the resistance of the resistor 131. C denotes the capacitance of the capacitor 11. Furthermore, t denotes the elapsed time from the beginning of discharge (that is, the transient response time). FIG. 5 is a waveform diagram illustrating the relationship between the time and the terminal voltage obtained during the transient response.

As is apparent from Equation 1, the equation allows the capacitance C of the capacitor 11 to be calculated. In the first embodiment, the capacitance calculator 154 calculates the capacitance C in accordance with Equation 1 based on period Tc from time t₂, when discharge is started, to time t₃, when the terminal voltage V reaches VL or lower. In this case, the capacitance calculator 154 uses VH, VL, and Tc as V₀ (initial voltage), V (the voltage obtained when the capacitance is detected), and t (transient response time), respectively.

That is, the capacitance calculator 154 calculates the capacitance C in accordance with Equation 2.

$$VL = VH \exp(-Tc/RC) \quad (2)$$

Based on Equation 2, the capacitance C is expressed by Equation 3.

$$C = -Tc/R(1/\ln(VL/VH)) \quad (3)$$

As is apparent from Equation 3, the capacitance calculator 154 calculates the capacitance C based on the measured period Tc, the resistance R of the resistor 131 of the discharger 13, voltage VH, and voltage VL. Here, the elements other than period Tc, that is, R, VH, and VL are predetermined. The capacitance detector 15 can determine the life of the capacitor 11 based on the capacitance C calculated by the capacitance calculator 154.

Here, unlike in the first embodiment, the capacitance C is calculated based on, for example, discharging the capacitor 11 at time t₄, when the terminal voltage V reaches voltage VH as shown in FIG. 2. In this case, accurately detecting the capacitance C is difficult as described below.

First, such a relationship as expressed by Equation 4 exists between the charge Q(t), capacitance C(t), and terminal voltage V(t) of the capacitor 11 at a given time t.

$$Q(t) = C(t)V(t) \quad (4)$$

Differentiating both sides of Equation 3 with respect to t results in Equation 5.

$$dQ(t)/dt = C(t)\partial V(t)/\partial t + V(t)\partial C(t)/\partial t \quad (5)$$

Between times t₀ and t₁ shown in FIG. 2, the second term of the right side of Equation 5 makes only insignificant contribution. Thus, Equation 5 is approximated by Equation 6.

$$dQ(t)/dt = C(t)dV(t)/dt \quad (6)$$

Then, between times t₄ and t₂ shown in FIG. 2, voltage V is almost constant. Thus, when the current supplied to the capacitor 11 at time t is denoted by I(t), Equation 5 is approximated by Equation 7.

$$dQ(t)/dt = V(t)dC(t)/dt$$
$$= I(t) \quad (7)$$

Equation 7 can be transformed into Equation 8.

$$dC(t)/dt = I(t)/V(t) \quad (8)$$

Both sides of Equation 8 are integrated over the period from time t₄ to time t₂ as expressed by Equation 9.

$$\int_{t4-t2} \{dC(t)/dt\} = \int_{t4-t2} \{I(t)/V(t)\} \quad (9)$$

In Equation 9, $\int_{t4}-t_2\{dC(t)/dt\}$ denotes the integration of dC(t)/dt over the period from time t₄ to time t₂, and $\int_{t4}-t_2\{I(t)/V(t)\}$ denotes the integration of I(t)/V(t) over the period from time t₄ to time t₂.

Based on Equation 9, the difference ΔC between the capacitance C(t$_2$) of the capacitor 11 at time t$_2$ and the capacitance C(t$_4$) of the capacitor 11 at time t$_4$ is expressed as shown in Equation 10.

$$\Delta C = C(t2) - C(t4) \quad (10)$$
$$= \int_{t4-t2} I(t)/V$$
$$= \{Q(t2) - Q(t4)\}/V$$

As is apparent from Equation 10, the capacitance C of the capacitor 11 varies depending on the timing when the capacitance C is detected. Thus, the capacitance C may be detected when stabilized (saturated). In the example illustrated in FIG. 4, the capacitance C is saturated at time t$_5$ between times t$_4$ and t$_2$. That is, the capacitance C is reliably already saturated at least by time t2. This is because the terminal voltage V of the capacitor 11 is maintained at voltage VH (that is, kept stable) at and after time t4 as described above.

Thus, in the first embodiment, to detect the capacitance C utilizing the transient response, the discharge controller 151 starts discharging the capacitor 11 at time t2, when the capacitance C is reliably saturated. This enables the capacitance C to be accurately detected. In contrast, if the capacitor 11 starts to be discharged, for example, at time t4, accurately detecting the capacitance C is difficult. Furthermore, it is assumed that unlike in the first embodiment, when the capacitance C is detected, the intermittent charge controller 16 performs intermittent charge control on the capacitor 11. Even in this case, the capacitance C varies. Therefore, it is difficult to accurately detect the capacitance C during the intermittent charge control.

The first embodiment increases the accuracy of detection of the capacitance C obtained immediately after power-on, by about 10% compared to the conventional art. This enables an increase in the reliability of the results of detection of the capacitance C and in the lower limit of a reference value (threshold) used to determine that the capacitance C is abnormal. For example, for a sample of a capacitor having a capacitance C decreasing to 70% of an initial value thereof when accumulated operation time reaches 70,000 hours, 70% of the initial value is defined as the threshold for determining that the capacitor has come to the end of its life. In this case, the conventional art needs to determine that the capacitor has come to the end of its life when the accumulated operation time reaches 20,000 to 30,000 hours. On the contrary, the first embodiment increases the accuracy of detection of the capacitance C by 10%, preventing the device from determining that the capacitor has come to the end of its life until the accumulated operation time reaches 40,000 to 60,000 hours.

When the terminal voltage V reaches VL or lower, the discharge controller 151 negates the control signal 130 and sets the intermittent charge mode to the on state. Thus, the intermittent charge controller 16 starts the intermittent charge control for intermittently charging the capacitor 11. In the first embodiment, when the terminal voltage V of the capacitor 11 reaches a second threshold voltage or lower, the intermittent charge controller 16, for example, asserts the enable signal 120 via the capacitance detector 15. In the first embodiment, the second threshold voltage is VL described above. However, the second threshold voltage may be lower than VL. In addition, the electronic device may comprise an OR gate configured to OR an enable signal output by the discharge controller 151 and an enable signal output by the intermittent charge controller 16. An output signal from the OR gate may be used as the enable signal 210.

Then, when the terminal voltage V reaches at least a first threshold voltage higher than the second threshold voltage, the intermittent charge controller 16 negates the enable signal 120. In the first embodiment, the first threshold voltage is VH. When the enable signal 120 is negated, the terminal voltage V falls gradually as a result of the self-discharge of the capacitor 11 as shown in FIG. 2. It is assumed that in this state, for example, at time t10 shown in FIG. 2, the capacitance C of the capacitor 11 needs to be measured again. In this case, at time t10, the discharge controller 151 asserts the enable signal 120, negates the control signal 130, and sets the intermittent charge mode to the off state.

Thereafter, at time t$_{11}$, the terminal voltage V reaches VLH again. The timer 153 then measures period Thold. During period Thold, the terminal voltage V reaches VH and is maintained at VH. At time t$_{12}$ shown in FIG. 2, the timer finishes measuring period Thold. The discharge controller 151 then negates the enable signal 120 and asserts the control signal 130. Thus, the capacitor 11 starts discharging again.

It is assumed that the terminal voltage V subsequently reaches voltage VL at time t$_{13}$. Then, the capacitance calculator 154 calculates the capacitance C of the capacitor 11 based on a period Tc' from time t12 to time t13. Period Tc' corresponds to above-described period Tc.

[Second Embodiment]

Figure 6:
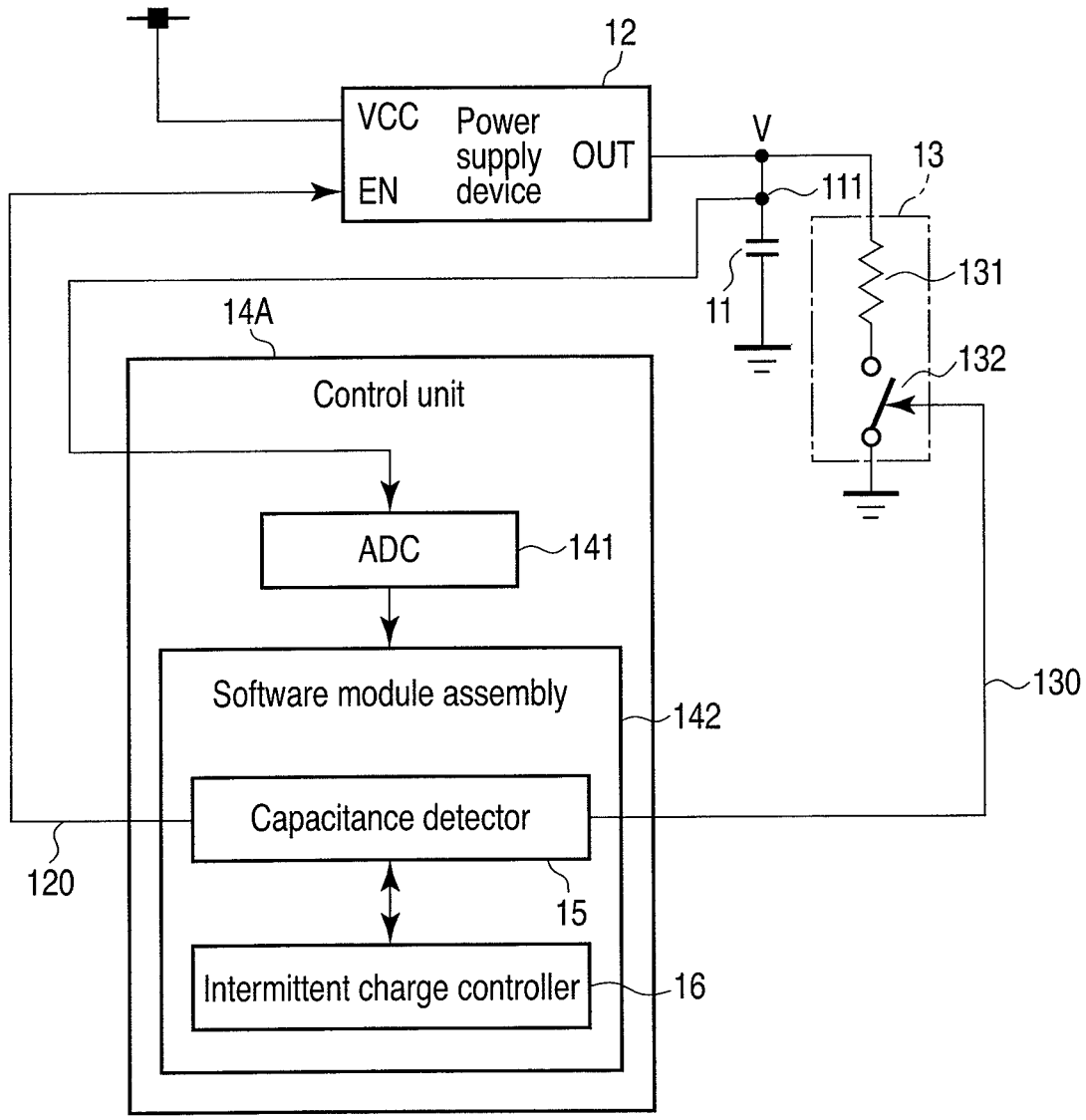
FIG. 6 is a block diagram showing an exemplary configuration of an electronic device according to a second embodiment.

Now, a second embodiment will be described. FIG. 6 is a block diagram showing an exemplary configuration of an electronic device according to the second embodiment. Components in FIG. 6 which are equivalent to corresponding ones in FIG. 1 are denoted by the same reference numbers. The electronic device shown in FIG. 6 differs from that shown in FIG. 1 in that a control unit 14A is used instead of the control unit 14. The control unit 14A comprises an analog-to-digital converter (ADC) 141 and a software module assembly 142. The analog-to-digital converter 141 digitizes the terminal voltage V of the capacitor 11.

The software module assembly 142 comprises a capacitance detector 15 and an intermittent charge controller 16. The capacitance detector 15 comprises the discharge controller 151, voltage detector 152, timer 153, and capacitance calculator 154 shown in FIG. 1, though these components are not shown in FIG. 6. However, in the second embodiment, not only the discharge controller 151 and the capacitance calculator 154 but also the voltage detector 152 is a software module. Furthermore, the timer 153 is a software timer (that is, a software module). In the second embodiment, the intermittent charge control is also a software module. The intermittent charge controller 16 may be a hardware module as is the case with the first embodiment.

Figure 7:
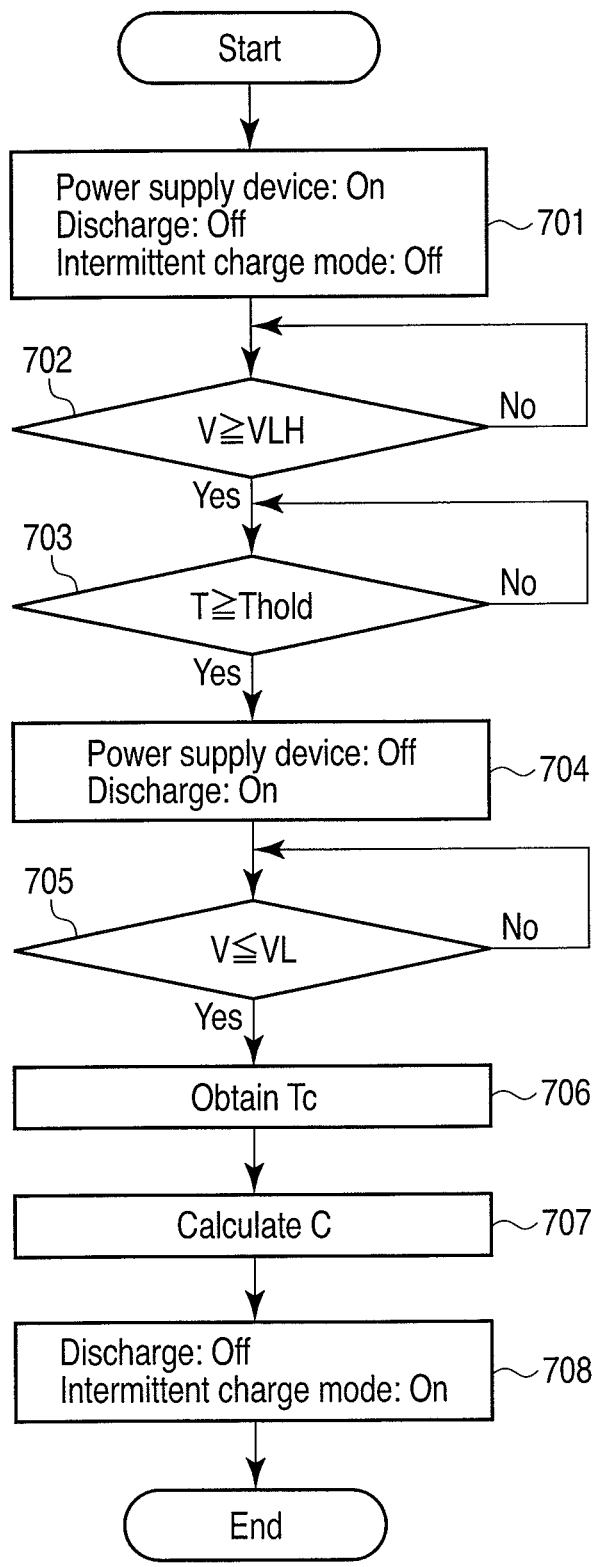
FIG. 7 is a flowchart illustrating an exemplary procedure for detecting the capacitance of a capacitor which procedure is applied in the second embodiment.

Now, the operation of the second embodiment will be described with reference to FIG. 2 and FIG. 7 taking, as an example, a case where the capacitance C of the capacitor 11 is detected. FIG. 7 is a flowchart illustrating a procedure for detecting the capacitance C of the capacitor 11. First, it is assumed that the capacitance detector 15 functions as the discharge controller 151 (see FIG. 1) at time t0 in order to detect the capacitance C of the capacitor 11. In this case, at time t0, the capacitance detector 15 asserts the enable signal 120, negates the control signal 130, and sets the intermittent charge controller 16 to the off state (block 701). That is, the capacitance detector 15 sets the power supply device 12 to the on state, sets the discharger 13 to a non-discharge state (discharge off state), and sets the intermittent charge mode to the off state.

Then, the capacitance detector 15 functions as the voltage detector 152 (see FIG. 1) to, for example, periodically determine whether the terminal voltage V of the capacitor 11 is at least VLH (V≥VLH) (block 702). If V≥VLH (Yes in block 702), the capacitance detector 15 functions as the timer 153 (see FIG. 1) to measure a time T from time t1, when V≥VLH is determined (detected).

Then, the discharge controller 151, for example, periodically determines whether the measured time T has reached a predetermined period Thold or longer (T≥Thold) (block 703). Here, it is assumed that at time t2, T≥Thold (Yes in block 703) as shown in FIG. 2. In this case, the capacitance detector 15 functions as the discharge controller 151 again to negate the enable signal 120, while asserting the control signal 130 (block 704). That is, the capacitance detector 15 sets the power supply device 12 to the off state and sets the discharger 13 to a discharge state (discharge on state). At this time, the intermittent charge mode remains off.

Furthermore, the capacitance detector 15 functions as the timer 153 again to measure the time from time t2, when T≥Thold is determined (detected). The capacitance detector 15 simultaneously functions as the voltage detector 152 to, for example, periodically determine whether the terminal voltage V of the capacitor 11 is equal to or lower than VL (V≤VL) (block 705). If V≤VL (Yes in block 705), the capacitance detector 15 obtains the measured period Tc from time t2 to time t3, when V≤VL is determined (detected) (block 706).

Then, the capacitance detector 15 functions as the capacitance calculator 154 (see FIG. 1) to calculate the capacitance C of the capacitor 11 based on the measured period Tc (block 707). The capacitance detector 15 then functions as the discharge controller 151 to set the discharger 13 to a discharge off state, while setting the intermediate charge mode to the on state (block 708). The intermediate charge controller 16 starts the intermediate charge control when the intermediate charge mode is set to the on state.

If the capacitance C of the capacitor 11 needs to be measured again also during the intermittent charge control, the capacitance detector 15 carries out again the processing starting at block 701 described above. Thus, the second embodiment can use the software module assembly 142 to implement the capacitance detector 15 and the intermittent charge controller 16.

[Third Embodiment]

Now, a third embodiment will be described. FIG. 8 is a block diagram showing an exemplary configuration of an electronic device according to the third embodiment. Components in FIG. 8 which are equivalent to corresponding ones in FIG. 1 are denoted by the same reference numbers. The electronic device shown in FIG. 8 differs from that shown in FIG. 1 in that a control unit 14B is used instead of the control unit 14. The control unit 14B comprises a capacitance detector 150 and an intermittent charge controller 160. The capacitance detector 150 comprises a discharge controller 151, a first voltage detector 152a, a timer 153, and a capacitance calculator 154. Unlike the capacitance detector 15 shown in FIG. 1, the capacitance detector 150 does not comprise a second voltage detector 152b.

The intermittent charge controller 160 comprises a Schmitt trigger 161. The Schmitt trigger 161 starts the intermittent charge control when set to the intermittent charge mode. When the terminal voltage V of the capacitor 11 reaches a second threshold or lower, the Schmitt trigger 161, for example, asserts the enable signal 120 via the capacitance detector 150. When the terminal voltage V reaches a first threshold higher than the second threshold, or higher, the Schmitt trigger 161 negates the enable signal 120. Thus, the Schmitt trigger 161 has a voltage detection function to detect the first threshold voltage and the second threshold voltage.

Thus, in the third embodiment, the second threshold voltage for the Schmitt trigger 161 is set equal to VL to allow the Schmitt trigger 161 to act also as the second voltage detector 152b in the first embodiment. Hence, the Schmitt trigger 161 operates even when not set to the intermittent charge mode, to detect that the terminal voltage V has reached the second threshold voltage (that is, VL) or lower. When not set to the intermittent charge mode, the discharge controller 151 inhibits an output from the Schmitt trigger 161 from being transmitted to the power supply device 12 as the enable signal 120.

As described above, in the third embodiment, the Schmitt trigger 161 substantially comprises the second voltage detector 152b. That is, in the third embodiment, the voltage detector 152 comprising the first voltage detector 152a and the second voltage detector 152b is present on both the capacitance detector 150 and the intermittent charge controller 160. The third embodiment can eliminate the need for the dedicated second voltage detector 152b. Furthermore, the intermittent charge controller 160 comprising the Schmitt trigger 161 allows the terminal voltage V to be kept at VL or higher even during the discharge of the capacitor 11. Thus, the capacitance C of the capacitor 11 can be detected, with the power supply backup function of the capacitor 11 maintained.

The voltage detector 152 in the first embodiment can be formed of a Schmitt trigger similar to the Schmitt trigger 161 (this Schmitt trigger is hereinafter referred to as the voltage detection Schmitt trigger). In this case, the first threshold for the voltage detection Schmitt trigger may be set equal to VLH. The second threshold for the voltage detection Schmitt trigger may be set equal to VL. Furthermore, this voltage detection Schmitt trigger may be applied in the second embodiment. In this case, the voltage detector 152 in the capacitance detector 15 need not be formed of a software module. Thus, the capacitance detector 15 is released from voltage monitoring and can easily measure the capacitance C. At least one of the above-described embodiments can provide an electronic device having a capacitor and which can accurately detect the capacitance of the capacitor even when the terminal voltage of the capacitor is unstable, as well as a capacitance detection method applied to the electronic device.

The various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device comprising:
a capacitor;
a power supplier configured to supply power to the capacitor; and
a controller configured to
saturate the capacitor by maintaining a terminal voltage of the capacitor for a first time range from a first time to a second time during which first time range the capacitor is reliably saturated,
start a discharge of the capacitor at the second time, and calculate a capacitance of the capacitor after starting the discharge, based on the terminal voltage maintained during saturation.

2. The electronic device of claim 1, wherein the controller comprises a discharge controller configured to detect a third time, before the first time, when the terminal voltage reaches a second voltage or higher, the second voltage being lower than a first voltage associated with the power supplier.

3. The electronic device of claim 2, wherein the discharge controller is further configured to stop the discharge effected by the controller when the terminal voltage reaches a third voltage or lower, the third voltage being lower than the second voltage.

4. The electronic device of claim 3, wherein the controller is configured to calculate the capacitance of the capacitor further based on a second time range from starting the discharge to end of the discharge.

5. The electronic device of claim 4, further comprising an intermittent charge controller configured to intermittently charge the capacitor,
wherein the discharge controller is further configured to inhibit operation of the intermittent charge controller at least during a third time range from the third time to the second time.

6. The electronic device of claim 5, wherein the intermittent charge controller is further configured to stop intermittent charge control by detecting that the terminal voltage has reached a first threshold voltage or higher and to start the intermediate charge control by detecting that the terminal voltage has reached a second threshold voltage or lower, the second threshold voltage being lower than the first threshold voltage.

7. The electronic device of claim 6, further comprising:
a first voltage detector configured to detect that the terminal voltage is the second voltage or higher; and
a second voltage detector configured to detect that the terminal voltage is the third voltage or lower,
wherein the discharge controller is further configured to detect a fourth time range from the third time, when the first voltage detector detects that the terminal voltage is the second voltage or higher, to at least the second time, and to stop the discharge when the second voltage detector detects that the terminal voltage is the third voltage or lower.

8. The electronic device of claim 7, wherein:
the second threshold voltage is equal to the third voltage;
the intermittent charge controller comprises a Schmitt trigger configured to detect that the terminal voltage is the third voltage or lower; and
the Schmitt trigger comprises the second voltage detector.

9. The electronic device of claim 6, wherein the first threshold voltage is equal to the first voltage.

10. The electronic device of claim 1, wherein the first time is a time when the capacitance of the capacitor initially becomes saturated.

11. A method for determining a capacitance of a capacitor configured to receive power from a power supplier, wherein the method comprises:

saturating the capacitor by maintaining a terminal voltage of the capacitor for a first time range from a first time to a second time during which first time range the capacitor is reliably saturated;
starting a discharge of the capacitor at the second time; and
calculating a capacitance of the capacitor after starting the discharge, based on the terminal voltage maintained during the saturation.

12. The method of claim 11, further comprising detecting a third time, before the first time, when the terminal voltage reaches a second voltage or higher, the second voltage being lower than a first voltage associated with the power supplier.

13. The method of claim 12, further comprising stopping the discharge when the terminal voltage reaches a third voltage or lower, the third voltage being lower than the second voltage.

14. The method of claim 13, wherein calculating the capacitance of the capacitor is further based on a second time range from starting the discharge to end of the discharge.

15. The method of claim 14, wherein:
the electronic device further comprises an intermittent charge controller configured to intermittently charge the capacitor; and
the method further comprises inhibiting operation of the intermittent charge controller at least during a third time range from the third time to the second time.

16. The method of claim 15, further comprising:
stopping intermittent charge control by detecting that the terminal voltage has reached a first threshold voltage or higher; and
starting the intermediate charge control by detecting that the terminal voltage has reached a second threshold voltage or lower, the second threshold voltage being lower than the first threshold voltage.

17. The method of claim 16, further comprising:
detecting that the terminal voltage is the second voltage or higher;
detecting that the terminal voltage is the third voltage or lower;
detecting a fourth time range from the third time, when the terminal voltage is detected to be equal to or higher than the second voltage, to the first time or more; and
stopping the discharge when a state where the terminal voltage is detected to be the third voltage or lower.

18. The method of claim 17, wherein:
the second threshold voltage is equal to the third voltage;
the intermittent charge controller comprises a Schmitt trigger; and
the terminal voltage is detected by the Schmitt trigger as the third voltage or lower.

19. The method of claim 16, wherein the first threshold voltage is equal to the first voltage.

20. The method of claim 11, wherein the first time is a time when the capacitance of the capacitor initially becomes saturated.

* * * * *